United States Patent
Citta et al.

(10) Patent No.: US 7,272,203 B2
(45) Date of Patent: Sep. 18, 2007

(54) DATA-DIRECTED FREQUENCY-AND-PHASE LOCK LOOP FOR DECODING AN OFFSET-QAM MODULATED SIGNAL HAVING A PILOT

(75) Inventors: Richard W. Citta, Oak Park, IL (US); Scott M. LoPresto, Mount Prospect, IL (US); Jingsong Xia, Mundelein, IL (US); Wenjun Zhang, Shanghai (CN)

(73) Assignee: Micronas Semiconductors, Inc., Palatine, IL (US)

( * ) Notice: Subject to any disclaimer, the term of this patent is extended or adjusted under 35 U.S.C. 154(b) by 649 days.

(21) Appl. No.: 10/404,553

(22) Filed: Apr. 1, 2003

(65) Prior Publication Data

US 2005/0074082 A1    Apr. 7, 2005

Related U.S. Application Data

(60) Provisional application No. 60/370,296, filed on Apr. 5, 2002, provisional application No. 60/370,295, filed on Apr. 5, 2002, provisional application No. 60/370,283, filed on Apr. 5, 2002.

(51) Int. Cl.
*H03D 3/24* (2006.01)
*H03H 7/30* (2006.01)

(52) U.S. Cl. .................................. 375/376; 375/232

(58) Field of Classification Search .......... 375/376, 375/232; 331/12, 1 A, 11, 16, 17; 329/308, 329/360
See application file for complete search history.

(56) References Cited

U.S. PATENT DOCUMENTS

| | | |
|---|---|---|
| 4,567,599 A | 1/1986 | Mizoguchi |
| 4,712,221 A | 12/1987 | Pearce et al. |
| 4,815,103 A | 3/1989 | Cupo et al. |
| 4,833,693 A | 5/1989 | Eyuboglu |
| 4,856,031 A | 8/1989 | Goldstein |
| 4,866,395 A | 9/1989 | Hostetter |
| 4,989,090 A | 1/1991 | Campbell et al. |

(Continued)

FOREIGN PATENT DOCUMENTS

EP    0524559 B1    5/1997

(Continued)

OTHER PUBLICATIONS

De Haan et al. "DeInterlacing-an Overview", Proceedings of the IEEE, vol. 86, No. 9, pp. 1837-1856 (Sep. 1998).

(Continued)

*Primary Examiner*—Khai Tran
(74) *Attorney, Agent, or Firm*—O'Shea, Getz & Kosakowski, P.C.

(57) ABSTRACT

A data-and-pilot directed frequency-and-phase lock loop for an offset-QAM modulated signal having a pilot signal comprising a pilot acquisition loop and a pair of data-directed acquisition loops. The pilot is extracted from the main signal by a pilot filter, then used both by the pilot acquisition loop and to remove the pilot from the signal to the data-directed acquisition loops. The outputs of the pilot and the two data-directed acquisition loops are summed and returned to the VCO to complete the feedback loop.

10 Claims, 9 Drawing Sheets

U.S. PATENT DOCUMENTS

| | | | |
|---|---|---|---|
| 5,052,000 A | 9/1991 | Wang et al. |
| 5,056,117 A | 10/1991 | Gitlin et al. |
| 5,058,047 A | 10/1991 | Chung |
| 5,127,051 A | 6/1992 | Chan et al. |
| 5,134,480 A | 7/1992 | Wang et al. |
| 5,142,551 A | 8/1992 | Borth et al. |
| 5,210,774 A | 5/1993 | Abbiate et al. |
| 5,278,780 A | 1/1994 | Eguchi |
| 5,311,546 A | 5/1994 | Paik et al. |
| 5,453,797 A | 9/1995 | Nicolas et al. |
| 5,471,508 A | 11/1995 | Koslov |
| 5,506,636 A | 4/1996 | Patel et al. |
| 5,508,752 A | 4/1996 | Kim et al. |
| 5,532,750 A | 7/1996 | De Haan et al. |
| 5,537,435 A | 7/1996 | Carney et al. |
| 5,568,098 A | 10/1996 | Horie et al. |
| 5,568,521 A | 10/1996 | Williams et al. |
| 5,588,025 A | 12/1996 | Strolle et al. |
| 5,619,154 A | 4/1997 | Strolle et al. |
| 5,648,987 A | 7/1997 | Yang et al. |
| 5,668,831 A | 9/1997 | Claydon et al. |
| 5,692,014 A | 11/1997 | Basham et al. |
| 5,757,855 A | 5/1998 | Strolle et al. |
| 5,781,460 A | 7/1998 | Nguyen et al. |
| 5,789,988 A | 8/1998 | Sasaki |
| 5,802,461 A | 9/1998 | Gatherer |
| 5,805,242 A | 9/1998 | Strolle et al. |
| 5,828,705 A | 10/1998 | Kroeger et al. |
| 5,835,532 A | 11/1998 | Strolle et al. |
| 5,862,156 A | 1/1999 | Huszar et al. |
| 5,870,433 A | 2/1999 | Huber et al. |
| 5,872,817 A | 2/1999 | Wei |
| 5,877,816 A | 3/1999 | Kim |
| 5,894,334 A | 4/1999 | Strolle et al. |
| 5,995,154 A | 11/1999 | Heimburger |
| 6,005,640 A | 12/1999 | Strolle et al. |
| 6,012,421 A | 1/2000 | Kusche et al. |
| 6,034,734 A | 3/2000 | De Haan et al. |
| 6,034,998 A | 3/2000 | Takashi et al. |
| 6,044,083 A | 3/2000 | Citta et al. |
| 6,069,524 A | 5/2000 | Mycynek et al. |
| 6,133,785 A | 10/2000 | Bourdeau |
| 6,133,964 A | 10/2000 | Han |
| 6,141,384 A | 10/2000 | Wittig et al. |
| 6,145,114 A | 11/2000 | Crozier et al. |
| 6,154,487 A | 11/2000 | Murai et al. |
| 6,178,209 B1 | 1/2001 | Hulyalkar et al. |
| 6,195,400 B1 | 2/2001 | Maeda |
| 6,198,777 B1 | 3/2001 | Feher |
| 6,219,379 B1 | 4/2001 | Ghosh |
| 6,222,891 B1 | 4/2001 | Liu et al. |
| 6,226,323 B1 | 5/2001 | Tan et al. |
| 6,233,286 B1 | 5/2001 | Wei |
| 6,240,133 B1 | 5/2001 | Sommer et al. |
| 6,249,544 B1 | 6/2001 | Azazzi et al. |
| 6,260,053 B1 | 7/2001 | Maulik et al. |
| 6,272,173 B1 | 8/2001 | Hatamian |
| 6,275,554 B1 | 8/2001 | Bouillet et al. |
| 6,278,736 B1 | 8/2001 | De Haan et al. |
| 6,304,614 B1 | 10/2001 | Abbaszadeh et al. |
| 6,307,901 B1 | 10/2001 | Yu et al. |
| 6,333,767 B1 | 12/2001 | Patel et al. |
| 6,356,586 B1 | 3/2002 | Krishnamoorthy et al. |
| 6,363,124 B1 | 3/2002 | Cochran |
| 6,411,341 B1 | 6/2002 | De Haan et al. |
| 6,411,659 B1 | 6/2002 | Liu et al. |
| 6,415,002 B1 | 7/2002 | Edwards et al. |
| 6,421,378 B1 | 7/2002 | Fukuoka et al. |
| 6,438,164 B2 | 8/2002 | Tan et al. |
| 6,452,639 B1 | 9/2002 | Wagner et al. |
| 6,466,630 B1 | 10/2002 | Jensen |
| 6,483,872 B2 | 11/2002 | Nguyen |
| 6,490,007 B1 | 12/2002 | Bouillet et al. |
| 6,493,409 B1 | 12/2002 | Lin et al. |
| 6,507,626 B1 | 1/2003 | Limberg |
| 6,535,553 B1 | 3/2003 | Limberg et al. |
| 6,570,919 B1 | 5/2003 | Lee |
| 6,573,948 B1 | 6/2003 | Limberg |
| 6,590,950 B1 * | 7/2003 | Mycynek ................... 375/376 |
| 6,611,555 B2 | 8/2003 | Smith et al. |
| 6,665,695 B1 | 12/2003 | Brokish et al. |
| 6,724,844 B1 | 4/2004 | Ghosh |
| 6,734,920 B2 | 5/2004 | Ghosh et al. |
| 6,829,298 B1 | 12/2004 | Abe |
| 6,980,059 B2 * | 12/2005 | Citta et al. ................... 331/12 |
| 6,995,617 B2 * | 2/2006 | Citta et al. ................. 331/1 A |
| 2001/0048723 A1 | 12/2001 | Oh |
| 2002/0024996 A1 | 2/2002 | Agazzi et al. |
| 2002/0051498 A1 | 5/2002 | Thomas et al. |
| 2002/0136329 A1 | 9/2002 | Liu et al. |
| 2002/0154248 A1 | 10/2002 | Wittig et al. |
| 2002/0172275 A1 | 11/2002 | Birru |
| 2002/0172276 A1 | 11/2002 | Tan et al. |
| 2002/0186762 A1 | 12/2002 | Xia et al. |
| 2002/0191716 A1 | 12/2002 | Xia et al. |
| 2003/0058967 A1 | 3/2003 | Lin et al. |
| 2003/0206600 A1 | 11/2003 | Vankka |
| 2004/0057538 A1 | 3/2004 | Sathiavageeswaran et al. |

FOREIGN PATENT DOCUMENTS

| | | |
|---|---|---|
| EP | 0752185 B1 | 7/2002 |
| WO | WO 00/27033 | 5/2000 |
| WO | WO 00/27066 | 5/2000 |
| WO | WO 01/01650 A1 | 1/2001 |
| WO | WO 01/13516 A2 | 2/2001 |
| WO | WO 01/43310 A2 | 6/2001 |
| WO | WO 01/43384 A2 | 6/2001 |

OTHER PUBLICATIONS

De Haan et al. "De-Interlacing of Video Data", IEEE Transactions on Consumer Electronics, vol. 43, No. 3, pp. 819-824 (Aug. 1997).

Wang et al. "Time-Recursive DeInterlacing for IDTV and Pyramid Coding", Elsevier Science Publishers B. V., vol. 2, No. 3, pp. 365-374 (Oct. 1990).

Demodulation of Cochannel QAM Signals (continued); Error Detection/Correction; pp. 1-3, http://www.appsig.com/papers/1813f/813f_4.html.

Demodulation of Cochannel QAM Signals (continued); Simulation Results; pp. 1-6; http://www.appsig.com/papers/1813f/813f_5.html.

Demodulation of Cochannel QAM Signals (continued); Error Detection/Correction; pp. 1-3, http://www.appsig.com/papers/1813f/813f_4.html, May 1989.

Demodulation of Cochannel QAM Signals (continued); Simulation Results; pp. 1-6; http://www.appsig.com/papers/1813f/813f_5.html, May 1989.

* cited by examiner

DATA-DIRECTED FREQUENCY-AND-PHASE LOCK LOOP FOR DECODING AN OFFSET-QAM MODULATED SIGNAL HAVING A PILOT

CLAIM OF PRIORITY

This utility patent application claims priority to U.S. Provisional Patent Applications Nos. 60/370,295, 60/370,283, and 60/370,296, all filed Apr. 5, 2002 the entire specifications of which are hereby incorporated herein.

BACKGROUND

In order to provide the widest possible coverage for a digital transmission, such as for cell phones or a digital television broadcast, it's desirable to use multiple transmitters that are separated from each other spatially. This permits a wider area to be covered, uses less total broadcast power, and can help to fill in dark areas where the transmission from one transmitter may be blocked. Thus, using multiple transmitters can provide wider and more complete coverage for virtually any digital transmission.

However, using multiple transmitters creates a serious problem when the receiver is at a "seam" between two transmitters, because the additional signal can appear as a "ghost" that can be as large as the "main" signal. Furthermore, destructive interference creates a series of perfect or near perfect nulls.

Existing receiver technology handles ghosts by filtering them out in order to interpret the "main" signal. But in a multi-transmitter environment this strategy is unworkable. It makes little sense to design a system to filter out a ghost that can be an arbitrarily large fraction of the "main" signal's size. Furthermore, near the margins, the best this subtractive strategy can ever provide is a signal strength equal to the stronger transmitter's signal—the energy from the secondary signal is wasted.

Even when the ghosts are smaller than 100% of the "main" signal, there is an equal probability of pre-and post-ghosts. In the most common situation, the strongest signal is the one following the most direct path. Ghosts are most often produced by "multipathing," that is, by portions of the signal following paths of different lengths from the transmitter to the receiver. Thus, ghosts are typically produced by one or more strong reflections. The first signal to arrive is typically the most direct, and therefore the strongest, and so in the usual situation the ghost is a post-ghost. In a multi-transmitter environment, though, while the receiver is near a seam the stronger signal can easily arrive after the ghost. With signals arriving from two directions, it is possible that the more direct path may be the longer one. Consequently, pre-ghosts are about as likely as post-ghosts, and may be arbitrarily strong. Furthermore, if the transmitters are out of sync with each other by even a small amount, where the one lagging happens to be the closer one, the receiver will likely see pre-ghosts.

Existing technology relies on the assumption that post-ghosts predominate (i.e., existing systems are not generally designed to deal with Raleigh fading). Thus, existing receivers generally will be either inefficient or incapable of dealing with a multi-transmitter environment, even if the ghosts are sufficiently small compared to the "main" signal.

In short, in a multi-transmitter environment, the "main" signal becomes a meaningless concept at the seams of the transmission. In order to operate efficiently in a multi-transmitter environment, a digital receiver must operate with a different paradigm. What is needed is a digital receiver that employs an additive strategy—that is, one in which the energy from one or more relatively large ghosts can be captured and used to aid in the synchronization process, rather than filtered out and discarded. Such a receiver could both function with ghosts 100% of the size of the "main" signal, and provide substantially superior performance whenever ghosts exceed about 70% of the size of the "main" signal. Since this condition can often occur even in a single-transmitter environment having a large number of reflective surfaces and masking objects, such a receiver would also provide greatly improved reception in, for example, urban environments.

In the typical transmitter-receiver system, from the receiver's perspective most of the signal is useless for synchronization, because it is indistinguishable from white noise. The more information that is packed into a signal, the more closely it will resemble white noise, so this is both a desirable and inevitable feature of the signal. Nevertheless, some bandwidth must be "wasted" in order to provide the receiver a means to orient itself. Typically, one of two strategies is employed. In some systems, a pilot signal is included. This is a sharp peak of energy in a very narrow frequency band, which is very easy for the receiver to pick out.

A phase-lock loop, such as the one shown in FIG. 1, indicated generally at 100, is a typical way to synch up a receiver using a pilot. A multiplier 110 multiplies the signal and the output of a voltage controlled oscillator 120 ("VCO") to produce a beat note (a sine wave with a frequency equal to the difference between the frequency of the pilot signal and the VCO's output). The beat note passes through a low-pass filter 130. The output of the filter 130 is amplified at 199 and input to the VCO 120 to complete the feedback loop. Those skilled in the art will appreciate that the low-pass filter 130 has competing design parameters. The more narrow the band pass of the filter 130 the smaller the response, so the slower the loop 100 is to lock up. However, a wide pass filter passes more noise and makes it harder for the loop 100 to capture at all.

It will be appreciated that the response of the loop 100 is driven by the frequency difference output of the first multiplier 110. The direction of error can only be determined by observing the slope of the time rate-of-change of the output. The second filter 130 distorts the sine wave, increasing the amplitude on the closer side, and decreasing it on the further side. Convergence is driven by this asymmetry of the distorted beat note.

However, because the amplitude of the beat note drops with increasing frequency difference, that distortion output drops as well, so the response of the phase-lock loop 100 decreases as the frequency of the VCO 120 diverges from the signal frequency. Thus, unless the signal happens to be close to the initial VCO 120 frequency, it will converge slowly, or not at all. A typical phase lock loop can capture when the initial VCO 120 frequency is within a factor of about 3-10 times the bandwidth of the loop.

Another, more robust, strategy for synching is to provide a signal in which information in the data is redundant in the frequency domain. The receiver can look for a correlation in the data created by this repetition to synch up. The receiver could use this same technique to find correlations in the data from signals from multiple transmitters. In mathematical terms, the correlation between the repeated signal portion can be identified by fully complex convolution. Convolution inherently corrects for the asymmetry produced by the slope of the Nyquist band, so that the peak value occurs when the limits of integration exactly correspond to the beginning and the end of the repeated data segment (and its negative time image).

A typical existing means for performing such a convolution is the Costas Loop, shown in FIG. 2. The Costas Loop operates on a complex signal, such as a QAM signal. As with the phase-lock loop, a first multiplier 210 multiplies the signal with the output of a VCO 220, though, as shown in FIG. 2, this is a complex multiplication, which produces both an I' (in phase) and a Q' (quadrature) output. As with the phase-lock loop, the output of the first multiplier is passed through a low-pass filter 230 where the unwanted (frequency sum) portion of multiplied signal is removed. The in-phase and quadrature portions are then multiplied by a second multiplier 240 to produce a beat note (assuming the sideband isn't balanced—otherwise it's merely a DC voltage.) The beat note is passed through a second low-pass filter 250, then amplified at 299 and returned to the VCO 220 to complete the feedback loop. Thus, the portion of the Costas loop following the second multiplier 240, which drives the convergence of the loop, is basically a phase-lock loop. Consequently, like the phase-lock loop, the Costas loop has the disadvantage of slow convergence.

A frequency-and-phase-lock loop ("FPLL") (shown in FIG. 3, and described in U.S. Pat. No. 4,072,909 to Citta, which is hereby incorporated by reference in its entirety) provides faster convergence. The FPLL has a first low-pass filter 330 and a second low-pass filter 350 which perform the function of the second low-pass filter 250 in the Costas loop, which separate the averaging and noise-elimination functions. Thus, the first low-pass filter 330 can have a relatively wide band pass, so that the FPLL can acquire even when the signal and initial VCO frequencies are off by as much as a factor of 1000. The second low-pass filter 350 can have a relatively narrow band-pass, in order to give good averaging during lock-up. The output of the second multiplier 340 is a rectified sine wave with a DC offset. The DC offset provides the direction information, rather than an integration of a distorted sine wave, which provides a much stronger response when the frequency difference is relatively large. The output of the second filter 350 is amplified at 399 and returned to the VCO 320 to complete the feedback loop.

Because of the way the FPLL uses the complex information to provide both magnitude and direction information, it locks up faster, and phase noise that is less than 90 degrees out of phase doesn't disrupt the lock. However, the FPLL does not perform a convolution of the data, and is therefore dependent upon a pilot to operate. It is therefore not suitable for use with, for example, a double sideband suppressed signal.

A data-directed frequency acquisition loop ("DDFL"), as disclosed in the concurrently-filed application, entitled Data-Directed Frequency Acquisition Loop, which is hereby incorporated in its entirety, and shown in FIG. 4, provides a data-synch loop which combines the desired features of the Costas Loop—synching by finding a correlation in repeated data through convolution—with the desired faster convergence of a frequency-and-phase-lock loop. The DDFL is indicated generally at 400. A first multiplier 410 multiplies the input signal by the output of a VCO 420. The output of the first multiplier 410 is filtered by a first low-pass filter 415, and the filtered output is squared by a second multiplier 430. The in-phase component is filtered by a second low-pass filter 440, then multiplied by the quadrature component by a third multiplier 450. The output of the third multiplier 450 is filtered by a third low-pass filter 460, amplified at 499, and returned to the VCO 420 to complete the feedback loop.

A data-directed frequency-and-phase lock loop ("DDFPLL"), as disclosed in the concurrently-filed application, entitled Data-Directed Frequency-and-Phase Lock Loop, which is hereby incorporated in its entirety, and is shown in FIG. 5 and indicated generally at 500, provides a data-synch loop that is even more robust than the DDFL.

As previously discussed, ghosting can create a series of perfect or near perfect nulls in the signal, especially in urban environments, which contain numerous reflective surfaces. Although the DDFL and DDFPLL provide robust mechanisms for synching a receiver, it is possible for a ghosts to destroy the portions of the signal containing the repeated data in the Nyquist slope. It will be appreciated that a pilot signal is an odd function, while redundant information in a Nyquist band is an even function. Therefore, it is impossible for any single ghost to annihilate both a pilot signal and the redundancy in the data. Therefore, with a system which can synch by either a pilot signal or redundancy in the data, the minimum arrangement of ghosts necessary to defeat lock-up requires an additional ghost.

Thus, what is needed is a system and method for synching a digital receiver by locking onto either a pilot signal or redundancy in the Nyquist slopes, in response to channel distortion that prevents acquisition by the other. The present invention is directed towards this need, among others.

SUMMARY OF THE INVENTION

A first embodiment data-and-pilot directed frequency-and-phase lock loop according to the present invention comprises: a signal input; a VCO; a first through tenth multipliers, a narrow band-pass filter; a first through fourth low-pass filters; and a first and second summers. The VCO has an in-phase and quadrature output. The first multiplier has as input the signal input and the in-phase and quadrature outputs of the VCO. The first multiplier further has a first output. The second multiplier has as input the first output, the second multiplier further having a second output. The narrow band-pass filter has as input the second output. The narrow band-pass filter further has a third output. The third multiplier has as input the third output. The third multiplier further has a fourth output that is a convolution of the third output. The fourth multiplier has as input the fourth output. The fourth multiplier further has a fifth output. The first low-pass filter has as input an in-phase component of the fifth output. The first low-pass filter further has a first filtered output. The fifth multiplier has as input the first filtered output and a quadrature component of the fifth output. The fifth multiplier further has a sixth output. The first summer has as input the second output and the third output. The first summer further has a seventh output that is a difference between the second output and the third output. The sixth multiplier has as input the seventh output, the sixth multiplier further has an eighth output that is a convolution of the seventh output. The seventh and eighth multipliers have as input the eighth output. The seventh and eighth multipliers further have a ninth and tenth output, respectively. The second and third low pass filters have as input in-phase portions of the ninth and tenth outputs, respectively. The second and third low pass filters have a second and third filtered output, respectively. The ninth and tenth multiplier have as inputs the second and third filtered outputs, respectively, and quadrature portions of the ninth and tenth outputs, respectively. The ninth and tenth multipliers further have an eleventh and twelfth outputs, respectively. The second summer has as input the sixth, eleventh, and twelfth outputs. The second summer further has a thirteenth output.

The fourth low-pass filter has as input the thirteenth output. The fourth low-pass filter further has a fourteenth output. The fourteenth output is returned to the VCO to complete a feedback loop.

A second embodiment data-and-pilot directed frequency-and-phase lock loop according to the present invention comprises a signal input, a VCO, a first through fifth multipliers; a narrow band-pass filter; a first through third low-pass filters; and a first and second summers. The VCO has an in-phase and quadrature output. The first multiplier has as input the signal input and the in-phase and quadrature outputs of the VCO. The first multiplier further has a first output. The narrow band-pass filter has as input the first output. The narrow band-pass filter further has a second output. The second multiplier has as input the second output. The second multiplier further has a third output that is a convolution of the second output. The first low-pass filter has as input an in-phase component of the third output. The first low-pass filter further has a first filtered output. The third multiplier has as input the first filtered output and a quadrature component of the third output. The third multiplier further has a fourth output. The first summer has as input the first output and the second output. The first summer further has a fifth output that is a difference between the first output and the second output. The fourth multiplier has as input the fifth output. The fourth multiplier further has sixth output that is a convolution of the fifth output. The second low pass filter has as input an in-phase portion of the fifth output. The second low pass filter has a second filtered output. The fifth multiplier has as inputs the second filtered output and a quadrature portion of the fifth output. The fifth multiplier further has sixth output. The second summer has as input the fourth and sixth outputs. The second summer further has a seventh output. The third low-pass filter has as input the seventh output. The third low-pass filter further has an eighth output. The eighth output is returned to the VCO to complete a feedback loop.

A third embodiment data-and-pilot directed frequency-and-phase lock loop according to the present invention comprises a pilot directed acquisition loop and a data-directed phase-lock loop. The pilot-directed acquisition loop has a pilot input and a pilot output. The data-directed phase-lock loop has a data input and a data output. The pilot output and the data output are used to produce a feedback signal that is a non-linear combination of the pilot input and the data input.

DETAILED DESCRIPTION OF THE PREFERRED EMBODIMENT

Figure 1:
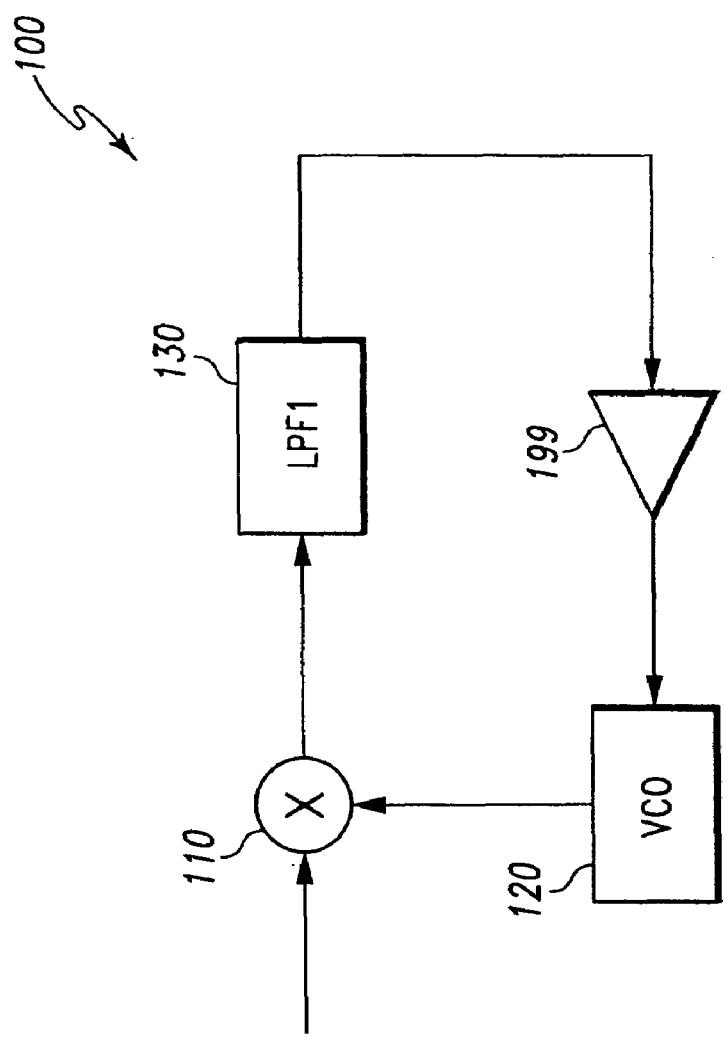
FIG. 1 is a prior art phase lock loop.
Figure 2:
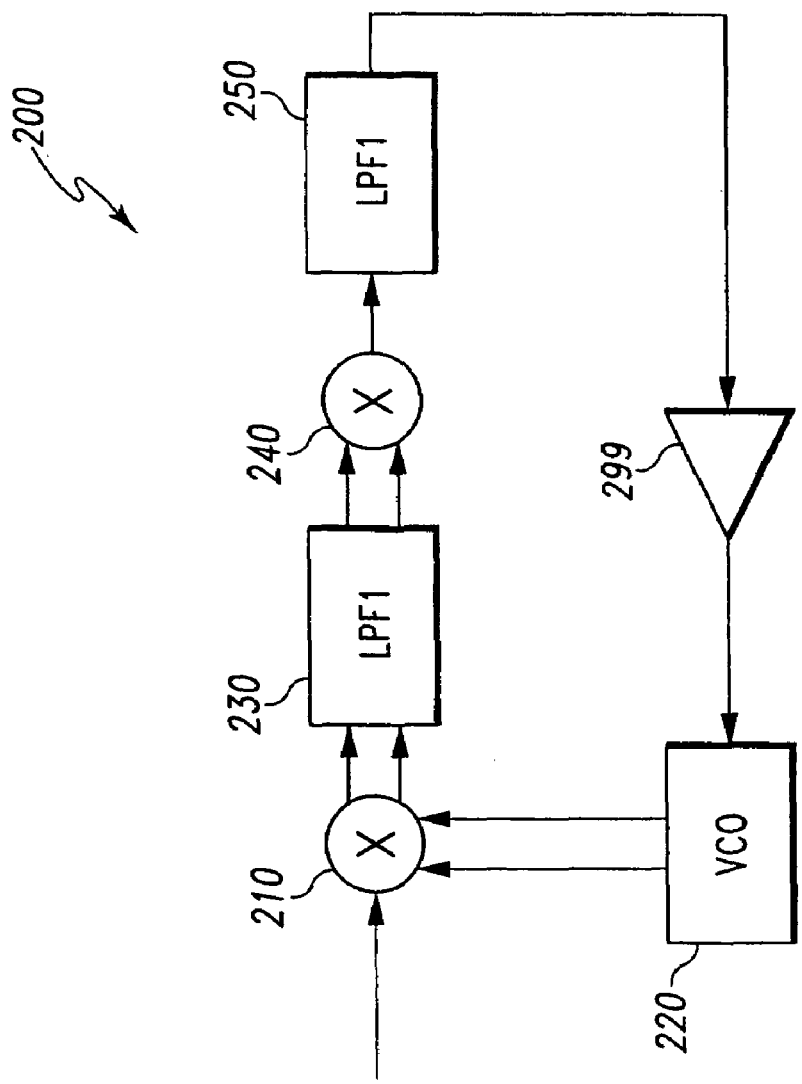
FIG. 2 is a prior art Costas loop.
Figure 3:
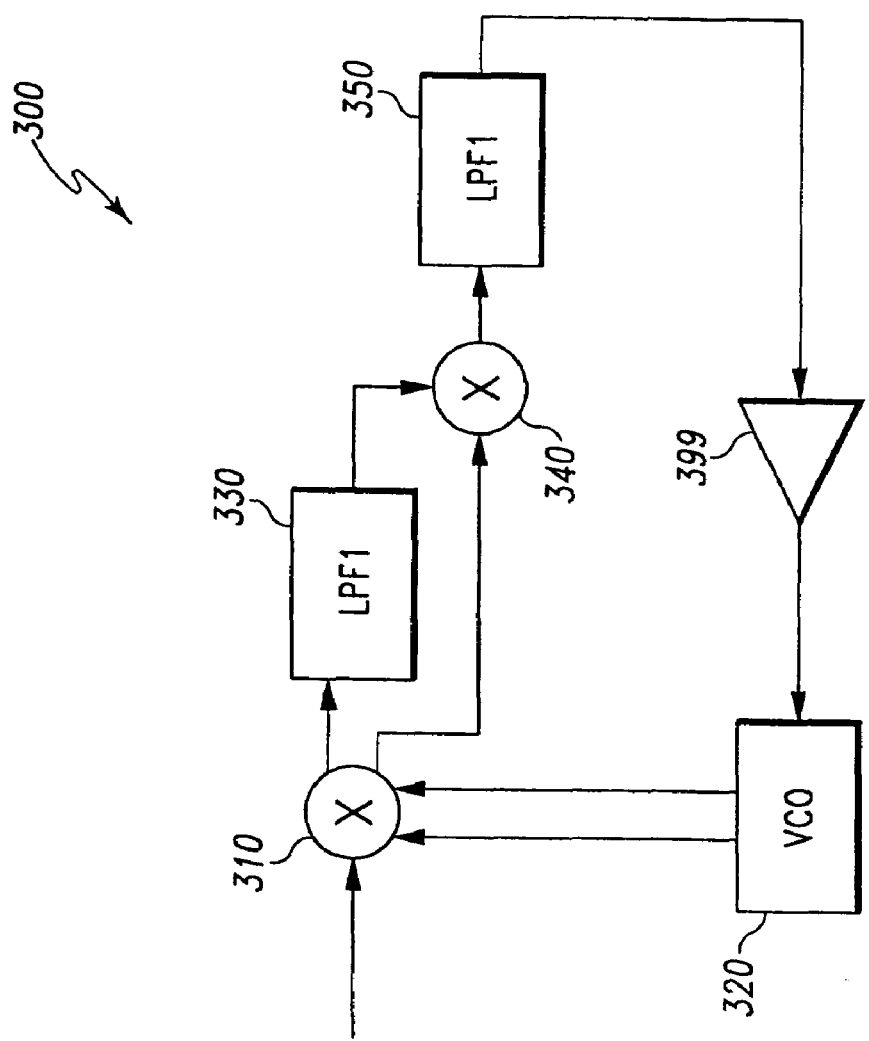
FIG. 3 is a prior art frequency-and-phase-lock loop.

For the purposes of promoting an understanding of the principles of the invention, reference will now be made to the embodiment illustrated in the drawings and specific language will be used to describe the same. It will nevertheless be understood that no limitation of the scope of the invention is thereby intended, and alterations and modifications in the illustrated device, and further applications of the principles of the invention as illustrated therein, are herein contemplated as would normally occur to one skilled in the art to which the invention relates.

A data-and-pilot directed frequency-and-phase lock loop ("DPDFPLL") according to the present invention provides extremely robust acquisition, even in the face of the worst receiving environments, including urban environments with multiple ghosts and perfect nulls. Furthermore, the DPDFPLL provides a robust, continuous control signal, even when confronted with a perfect null, regardless of its phase. The DPDFPLL operates by simultaneously using a pilot signal and signal redundancy in both Nyquist slopes in an offset-QAM signal. As with the DDFL and DDFPLL, during lock-up the DPDFPLL combines desirable features of a Costas loop and a frequency-and-phase-lock loop; the DDF-PLL synchs using redundancy of the data in the frequency domain, such as in a double sideband suppressed signal, but has an output that converges like the FPLL, and that is not disrupted by noise that displaces the signal phase by 90 degrees or less. Additionally, the DPDFPLL comprises a loop that synchs using a pilot signal. Together, these loops produce a circuit that provides uniquely robust frequency acquisition and phase-lock.

Figure 6:
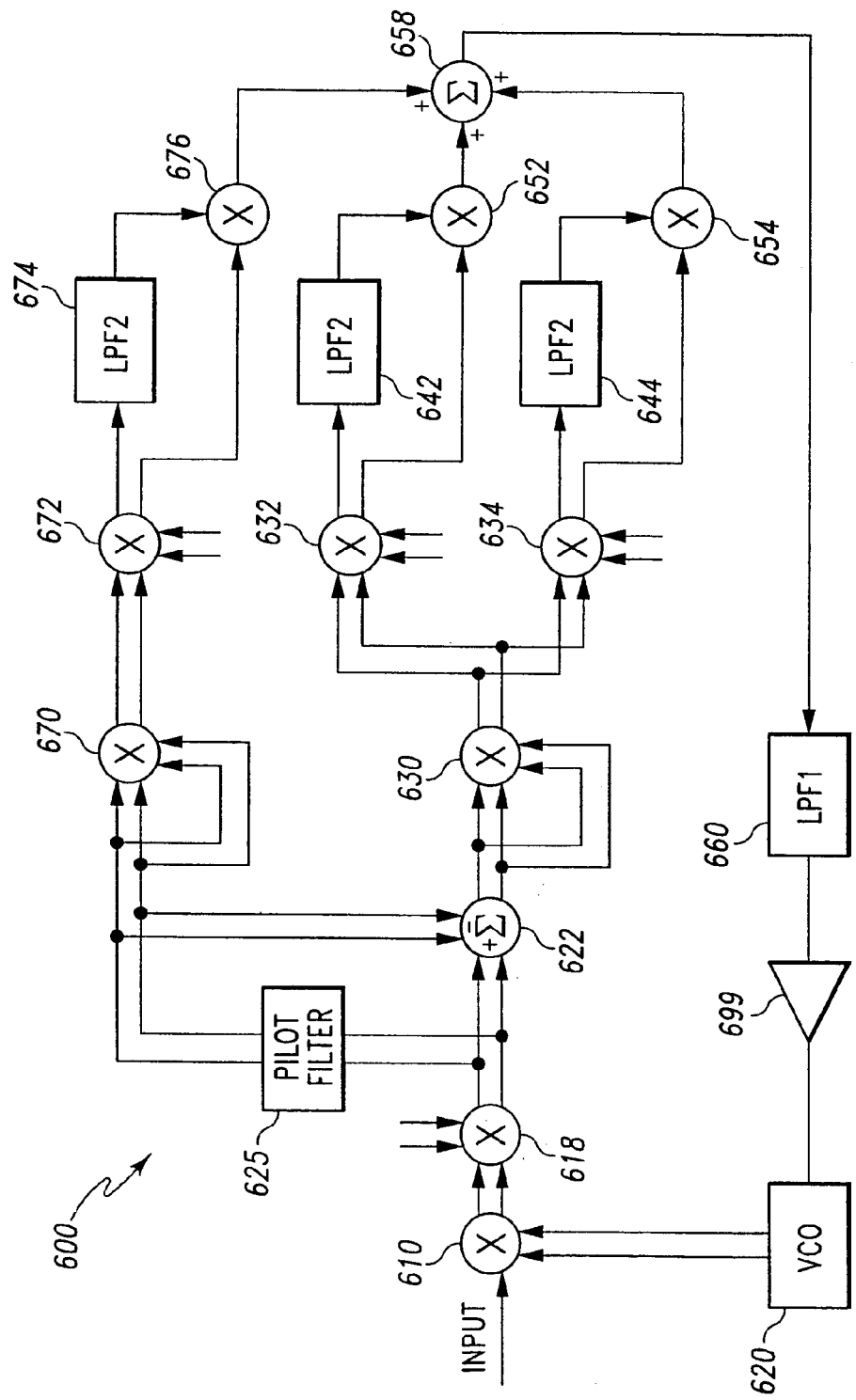
FIG. 6 is a data-and-pilot directed frequency-and-phase lock loop according to the present invention.

A preferred embodiment DPDFPLL according to the present invention is shown in FIG. 6, and indicated generally at 600. The input signal and the output of a VCO 620 are multiplied by a first multiplier 610. The output of the first multiplier 610 is multiplied with a fixed frequency by a second multiplier 618. In the preferred embodiment this frequency is ¼ of the symbol rate, since this requires multiplication only by 1 and −1, and because it provides the maximum separation of the correlations of the two Nyquist slopes, but it will be appreciated that any frequency can theoretically be used.

The output of the second multiplier 618 is sent both to a first summer 622, and to a pilot filter 625. The pilot filter 625 is a narrow band-pass filter centered about the frequency where the pilot signal is expected. The output of the pilot filter 625 is then used both in a pilot acquisition loop, as described further hereinbelow, and also to remove the pilot from the signal used in two data-directed acquisition loops, as described further hereinbelow.

The output of the pilot filter 625 is used in a pilot acquisition loops as follows: The pilot signal is convolved by a third multiplier 670. The output of the third multiplier 670 is shifted by a fourth frequency-shift multiplier 672. The fourth frequency-shift multiplier 672 reverses the effect of the second frequency-shift multiplier 618. As will be apparent to those skilled in the art, in the preferred embodiment the fourth frequency-shift multiplier multiplies by ¾ of the symbol rate, in order to reverse the multiplication by ¼ of the symbol rate performed by the second multiplier 618. It will be appreciated that the function of the second frequency-shift multiplier 618 is to permit the pair of data-directed acquisition loops to simultaneously find the correlations in the data in the two Nyquist slopes by offsetting their respective power spectra so they are not centered at the same origin. Thus, the second and fourth frequency-shift multipliers 618 and 672 are not needed for the operation of the pilot acquisition loop by itself, but to permit it to function in conjunction with the two data-directed acquisition loops.

The in-phase output of the fourth multiplier 672 is then filtered by a low-pass filter and then multiplied with the quadrature output by a fifth multiplier 676, as in a typical frequency-and-phase lock loop. The output of the fifth multiplier 676 is then sent to a second summer 658, where it is summed with the outputs of the pair of data-directed acquisition loops, as described hereinbelow.

The output of the pilot filter 625 is used in a pair of data-directed acquisition loops as follows: The output of the pilot filter 625 subtracted from the output of the second multiplier 618 by the first summer 622. The resulting signal is convolved by a sixth multiplier 630. The output of the sixth multiplier 630 is used to synch up through a pair of frequency acquisition loops. The signal is sent to a seventh frequency-shift multiplier 632 and an eighth frequency-shift multiplier 634. In the preferred embodiment the frequency-shifts generated by these multipliers are ¼ and ¾ of the symbol rate, but it will be appreciated that this is a function of the frequency shift imposed by the second multiplier 618. (The difference between the seventh and eighth frequency-shift multipliers 632 and 634 will always be ½ a cycle.) The in-phase portions of the outputs of the frequency-shift multipliers 632 and 634 are filtered by low pass filters 642 and 644, and then multiplied by the corresponding quadrature portion of the outputs of the phase-shift multipliers 632 and 634, by a ninth multiplier 652 and a tenth multiplier 654, respectively. The outputs of the ninth and tenth multipliers 652 and 654 are summed by the second summer 658.

The output of the second summer 658 is filtered by a third low-pass filter 660, amplified at 699, and returned to the VCO 620 to complete the feedback loop.

Figure 5:
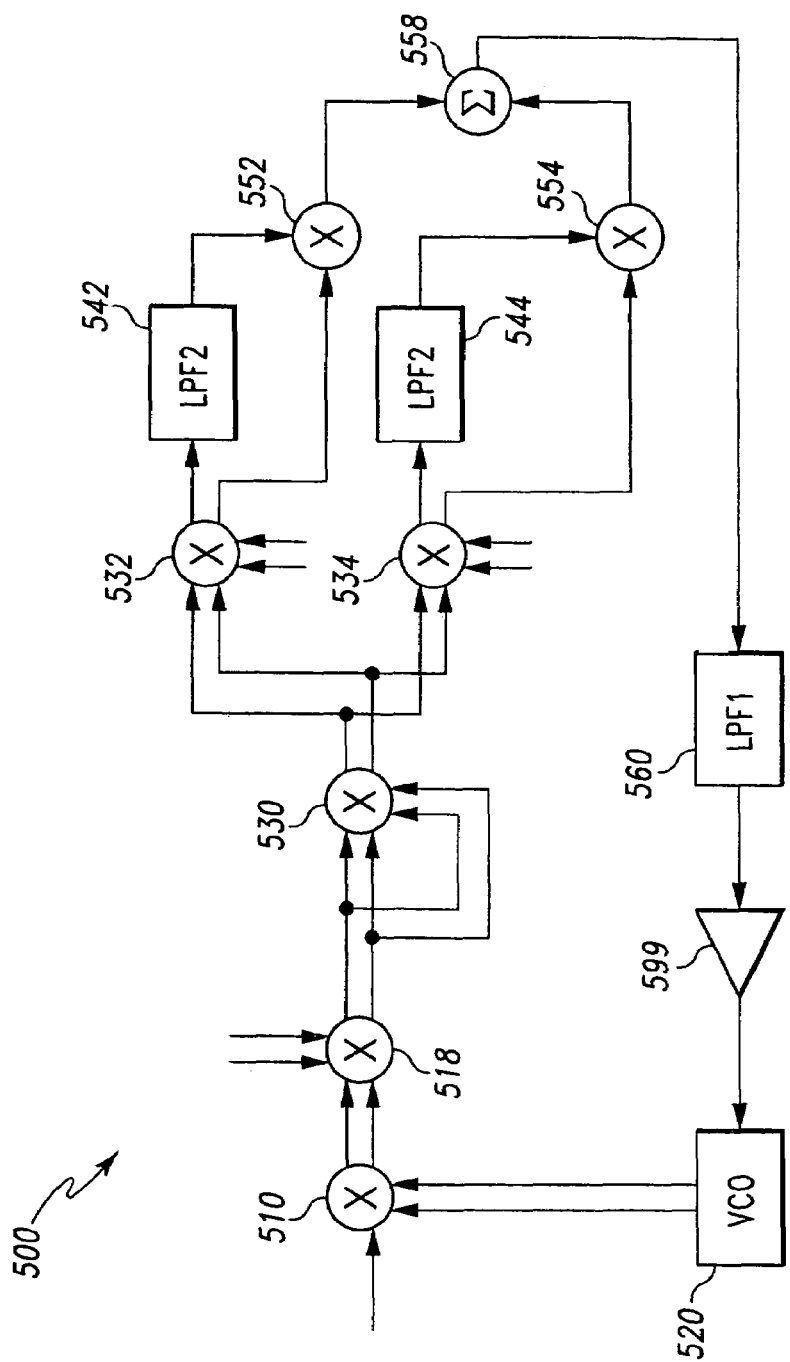
FIG. 5 is a data-directed frequency-and-phase lock loop.

It will be appreciated that the data-and-pilot frequency-and-phase lock loop 600 comprises a DDFPL, similar to the one shown in FIG. 5, combined with a pilot-directed frequency acquisition loop. The pilot-directed frequency acquisition loop comprises the complex multiplier 670, frequency-shift multiplier 672, low-pass filter 674, and offset-multiplier 676. The frequency-shift multiplier 672 is added to a typical prior art pilot-directed acquisition loop in order to effectively combine it with the data-directed loop, as described hereinabove.

Figure 7:
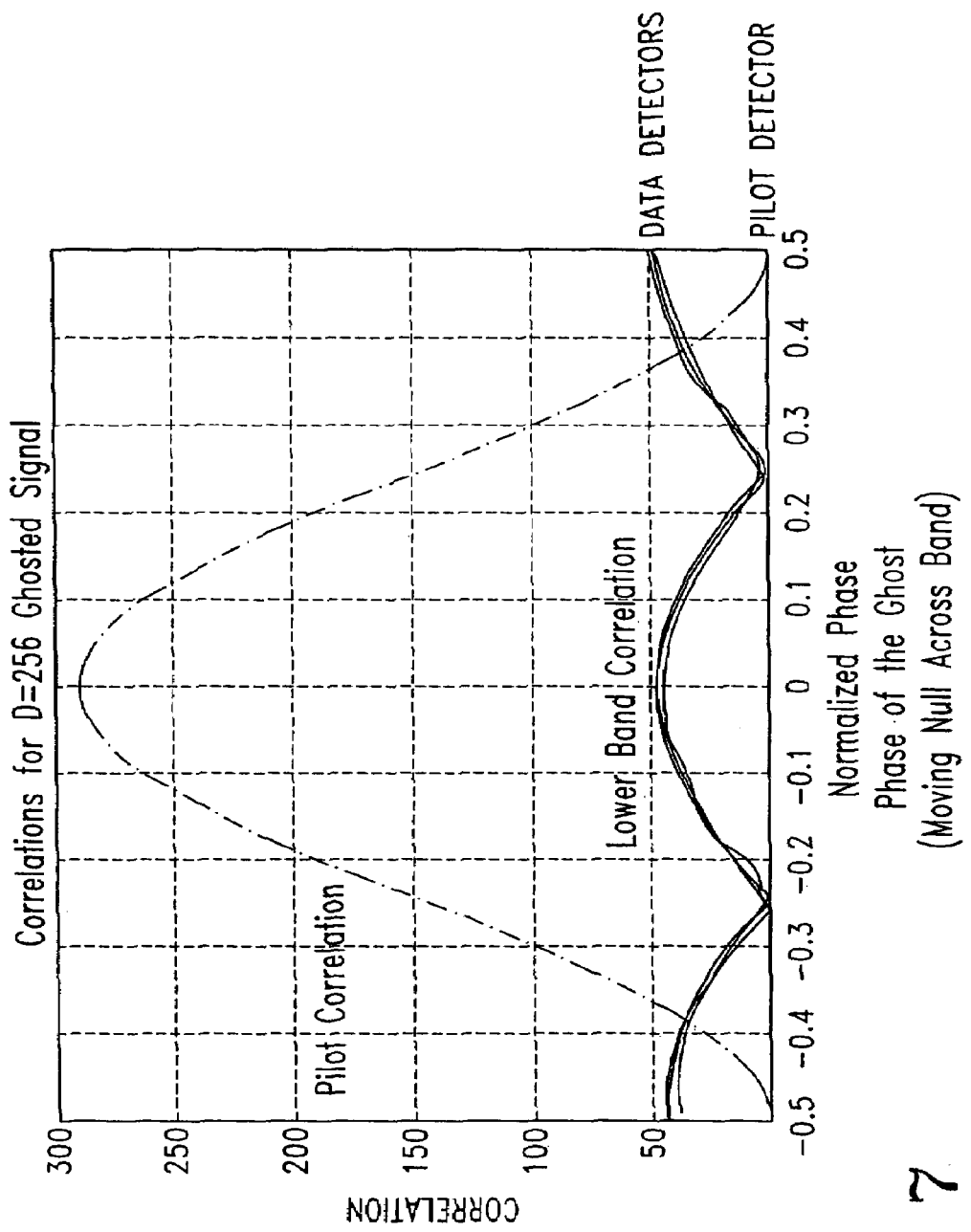
FIG. 7 is a graph showing the magnitude of the individual correlation signals of the pilot detector and the data detector in a data-and-pilot directed frequency-and-phase lock loop according to the present invention.
Figure 8:
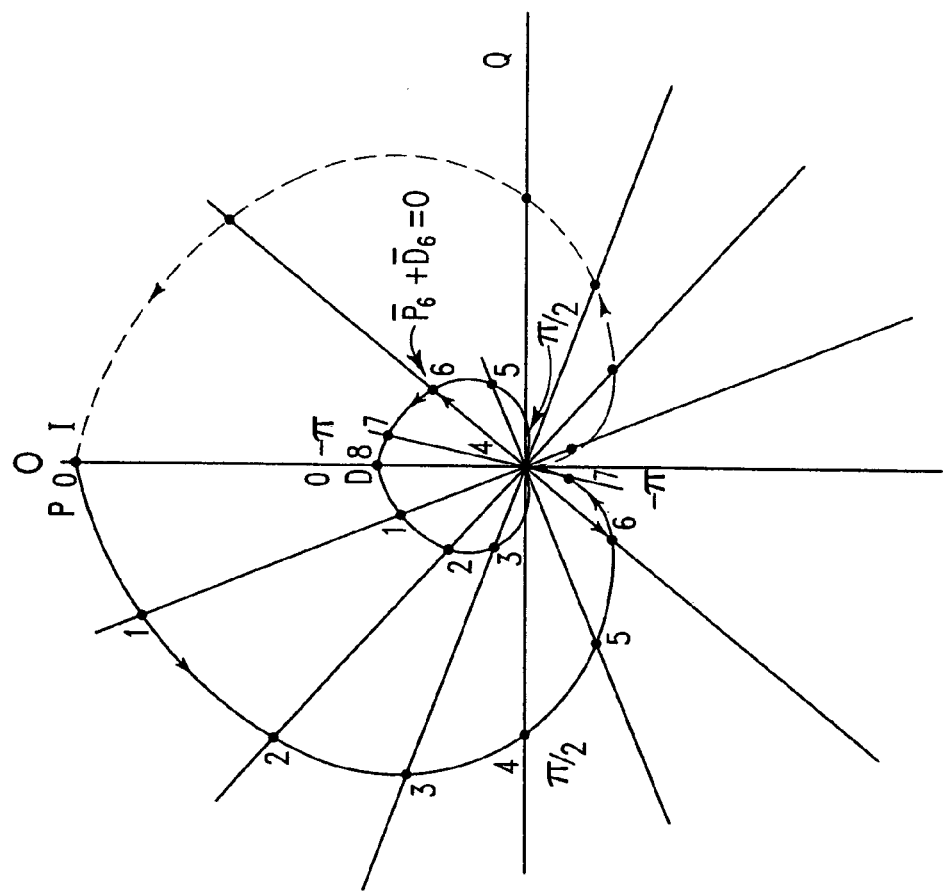
FIG. 8 is a graph of the in-phase and quadrature components of the correlation in a pilot detector and in a data detector, respectively, of a data-and-pilot directed frequency-and-phase lock loop according to the present invention.

FIGS. 7 and 8 illustrate an important advantage of combining a data-directed phase-lock loop with a pilot-directed acquisition loop. FIG. 7 is a graph showing the magnitude of the individual correlation signals of the pilot detector and the data detector in the circuit 600 as a function of the phase of a perfect null ghost as it travels through a complete cycle (i.e., the magnitude of the signals being input to the adder 658 from the pilot-directed loop and from the data-directed loop, respectively). The curve 710 is the magnitude of the correlation signal of the data detector, and the curve 720 is the magnitude of the pilot detector. When the perfect null is perfectly aligned with the pilot, the pilot is annihilated, and the pilot detector provides no feedback signal. Likewise, when the perfect null is properly aligned, the data detector is zeroed. The remarkable robustness of the data-and-pilot directed frequency-and-phase lock loop derives in part from the fact that these zeros do not line up—whenever the pilot detector is zeroed, the data detector has a good response, and vice versa. Consequently, it is absolutely impossible for any single ghost to completely zero both the pilot detection and the data detection.

FIG. 8 illustrates the principle that permits the pilot-directed loop and the data-directed loop to be combined effectively. FIG. 8 is a graph of the in-phase and quadrature components of the correlation in the pilot detector 810 and in the data detector 820, respectively (i.e., the inputs to the multiplier 676 and to the multipliers 652 and 654, respectively). Through the first quarter of a cycle (points A through E) the outputs of the pilot detector and data detector could simply be summed. That is, the in-phase and quadrature components of the outputs of the correlators 670 and 630 could be added, and then multiplied by a single multiplier. But the data detector passes through a null at point E, and thereafter reverses sign. Between point E and point G the sum would still drive convergence, but more weakly than the pilot detector alone would. At point G the pilot detector and data detector would be exactly canceling each other, producing a null. Past point G the sum would actually be driving away from a lock.

However, by combining the pilot detector and the data detector non-linearly a phase-lock signal can be produced that has no nulls. This is possible because, as shown in FIG. 8, the phase relationship between the pilot detector's signal and the data detector's signal are always either the same, or exactly 180° out from each other. Thus, if the data detector's signal is inverted during the portions of a cycle in which they are 180° out, the result is a smooth signal with no nulls. This is exactly what a DDFPL does, as discussed in the concurrently filed application entitled Data-Directed Frequency-and-Phase Lock Loop. Thus, the output of a DDFPL can be combined directly with the output of a pilot-directed phase-lock loop, as is done in the preferred embodiment by the adder 658.

It will be appreciated that other non-linear ways to combine the output of a pilot detector and a data detector may also be used. For example, a multiplier could be used to directly invert the in-phase portion of the data detector's signal during the appropriate half-phase. This configuration would actually require slightly less hardware than the preferred embodiment (one less multiplier), but this embodiment converges less efficiently.

It will be appreciated that, though the pilot signal is typically located in the lower Nyquist band in an offset-QAM signal, it could also be positioned in the upper Nyquist band. In this case the frequency shift multiplier should be reversed, so that the first multiplier 610 multiplies by ¾ of the symbol rate, and the fourth multiplier 618 multiplies by ¼ of the symbol rate.

It will likewise be appreciated that the circuit 600 can be adapted for use with a QAM signal, in which the pilot is centered. In this case, there is no need for any of the frequency-shift multipliers (including the seventh frequency-shift multiplier 632, discussed further hereinbelow), nor for the low-pass filter 642 and ninth multiplier 652, since the pilot and the data would already be separated.

Figure 9:
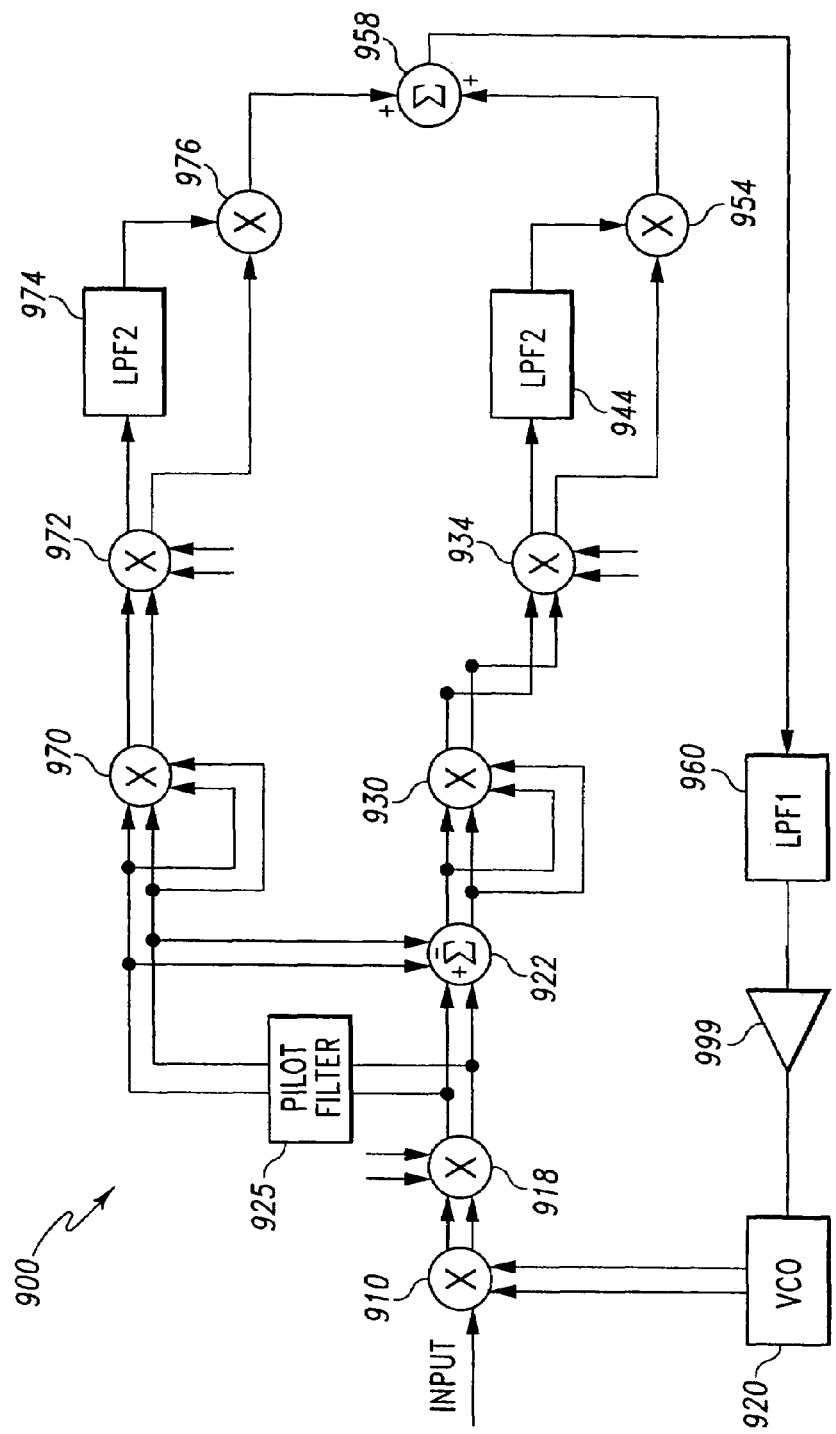
FIG. 9 shows an alternative embodiment data-and-pilot directed frequency-and-phase lock loop according to the present invention.

Those skilled in the art will also appreciate that other pilot-based phase-lock loops and data-directed phase-lock loops can be combined to produce a data-and-pilot directed frequency-and-phase lock loop according to the present invention. For example, FIG. 9 shows an alternative embodiment DPDFPLL circuit 900 according to the present invention with somewhat simpler hardware than the preferred embodiment circuit 600, in which corresponding elements have been numbered correspondingly (so the VCO 620 in the circuit 600 is numbered 920 in the circuit 900).

Figure 4:
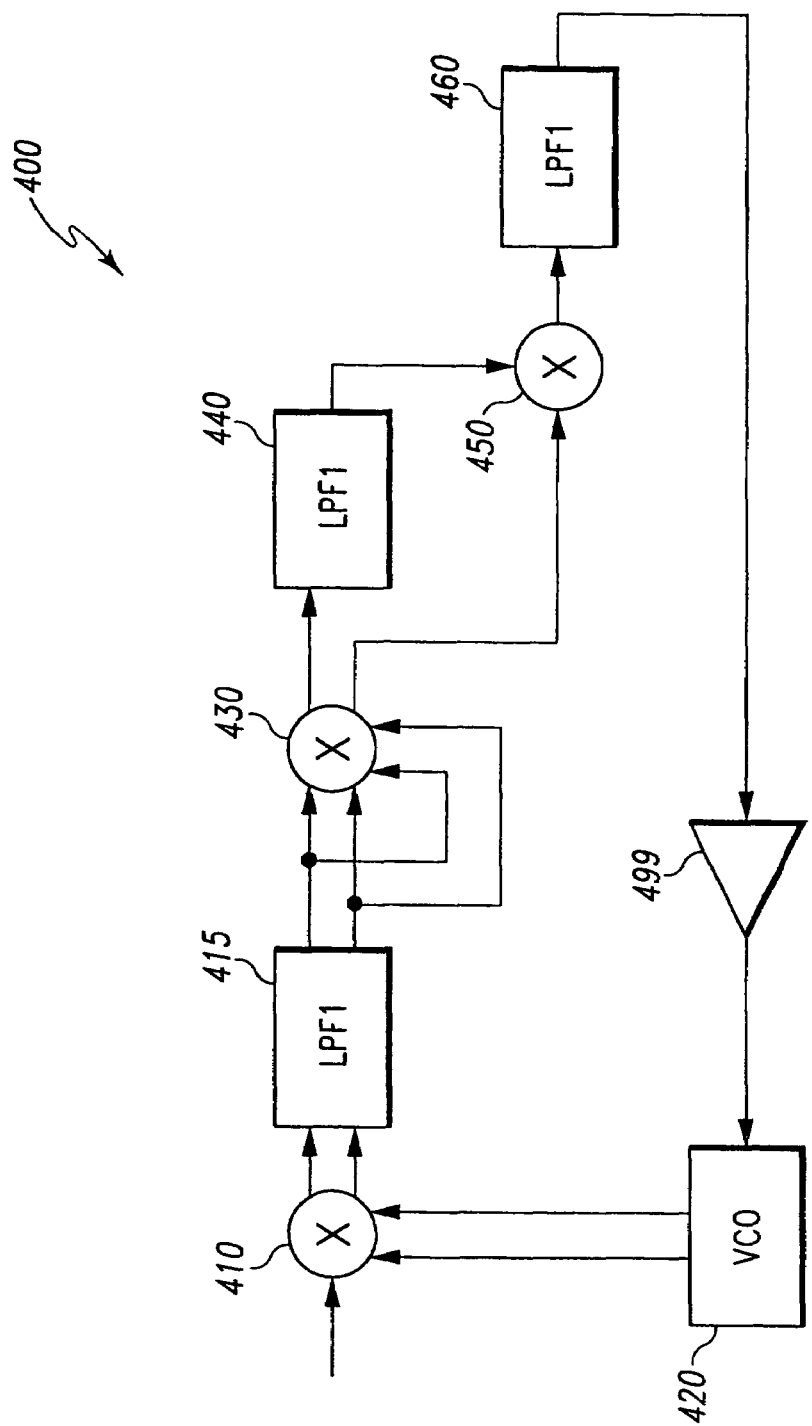
FIG. 4 is a data-directed frequency-acquisition loop.

The circuit 900 comprises a DDFL similar to the one shown in FIG. 4 (comprising the complex multiplier 930, low pass filter 942, and multiplier 952), combined with a pilot acquisition loop (comprising the complex multiplier 970, low-pass filter 974, and multiplier 976). The DDFL has the same characteristic as does the DDFPL in the preferred embodiment, of inverting the output (relative to, for example, a Costas loop) during half of a cycle, so that it functions in a circuit according to the present invention analogously to the DDFPL used in the preferred embodiment. It will be appreciated that the DDFL and the pilot acquisition loop in the circuit 900 have identical hardware configurations; the difference in their inputs is the only thing that distinguishes them.

Other alternative embodiments can likewise be formed by the non-linear combination of the correlation of a pilot signal and of a double-sideband suppressed data signal, as will be apparent to those skilled in the art.

Certain other alternative embodiments can be formed by the substitution, permutation, or both, of the elements of any of these embodiments. For example, elements of the circuit 600 shown in FIG. 6 can be substituted, permutated, or both, to produce a number of equivalent alternative embodiment circuits. In this example, it will be appreciated that the amplifier 699 may actually be incorporated into the filter 660. Those skilled in the art will recognize that filters typically include amplification to offset reductions in signal strength caused by the filtering. It will be appreciated that the amplification could equivalently be performed by a separate amplifier, either prior to or after filtration.

Furthermore, it will be appreciated that many of the multipliers can actually be substantially simpler hardware components. For example, the VCO can simply produce a signal of oscillating 1s and −1s. In this case, the potential multiplication required by the multipliers comprising the first complex multiplier 610 is limited to a change of signs. Similarly, two of the real multipliers comprising the second multiplier 630 multiply the same input by itself. Thus, the range of possible outputs contains only half the possibilities of the domain of inputs. Consequently, this function can more easily be performed by a lookup table that provides the square of the input than by an actual multiplier, which requires many more gates. Other simplifications of the hardware are possible, and will be apparent to persons of ordinary skill in the art.

While the invention has been illustrated and described in detail in the drawings and foregoing description, the same is to be considered as illustrative and not restrictive in character, it being understood that only the preferred embodiment, and certain other embodiments deemed helpful in further explaining how to make or use the preferred embodiment, have been shown. All changes and modifications that come within the spirit of the invention are desired to be protected.

We claim:

1. A data-and-pilot directed frequency-and-phase lock loop having a symbol rate, comprising:
    a signal input;
    a VCO having an in-phase and a quadrature output;
    a first multiplier having as input the signal input and the in-phase and quadrature outputs of the VCO, the first multiplier further having a first output;
    a second multiplier having as input the first output, the second multiplier further having a second output;
    a narrow band-pass filter having as input the second output, the narrow band-pass filter further having a third output;
    a third multiplier having as input the third output, the third multiplier further having a fourth output that is a convolution of the third output;
    a fourth multiplier having as input the fourth output, the fourth multiplier further having a fifth output;
    a first low-pass filter having as input an in-phase component of the fifth output, the first low-pass filter further having a first filtered output;
    a fifth multiplier having as input the first filtered output and a quadrature component of the fifth output, the fifth multiplier further having a sixth output;
    a first summer having as input the second output and the third output, the first summer further having a seventh output that is a difference between the second output and the third output;
    a sixth multiplier having as input the seventh output, the sixth multiplier further having an eighth output that is a convolution of the seventh output;
    seventh and eighth multipliers having as input the eighth output, the seventh and eighth multipliers further having a ninth and tenth output, respectively;
    second and third low pass filters having as input in-phase portions of the ninth and tenth outputs, respectively, the second and third low pass filters having a second and third filtered output, respectively;
    ninth and tenth multipliers having as inputs the second and third filtered outputs, respectively, and quadrature portions of the ninth and tenth outputs, respectively, the ninth and tenth multipliers further having an eleventh and twelfth outputs, respectively;
    a second summer having as input the sixth, eleventh, and twelfth outputs, the second summer further having a thirteenth output; and
    a fourth low-pass filter having as input the thirteenth output, the fourth low-pass filter further having a fourteenth output;
    wherein the fourteenth output is returned to the VCO to complete a feedback loop.

2. The data-and-pilot directed frequency-and-phase lock loop of claim 1, wherein:
    the second multiplier multiplies by ¼ the symbol rate;
    the fourth multiplier multiplies by ¾ the symbol rate; and
    the seventh and eighth multipliers multiply by ¼ and ¾ the symbol rate, respectively.

3. The data-and-pilot directed frequency-and-phase lock loop of claim 1, wherein the seventh and eighth multipliers multiply by fixed frequencies having a difference of ½ the symbol rate.

4. The data-and-pilot directed frequency-and-phase lock loop of claim 1, wherein the second and fourth multipliers multiply by fixed frequencies that add up to the symbol rate.

5. The data-and-pilot directed frequency-and-phase lock loop of claim 1, wherein the second multiplier multiplies only by 1 and −1.

6. The data-and-pilot directed frequency-and-phase lock loop of claim 1, wherein the narrow band-pass filter is centered about an expected pilot frequency.

7. A data-and-pilot directed frequency-and-phase lock loop, comprising:
    a signal input;
    a VCO having an in-phase and quadrature output;
    a first multiplier having as input the signal input and the in-phase and quadrature outputs of the VCO, the first multiplier further having a first output;
    a narrow band-pass filter having as input the first output, the narrow band-pass filter further having a second output;

a second multiplier having as input the second output, the second multiplier further having a third output that is a convolution of the second output;

a first low-pass filter having as input an in-phase component of the third output, the first low-pass filter further having a first filtered output;

a third multiplier having as input the first filtered output and a quadrature component of the third output, the third multiplier further having a fourth output;

a first summer having as input the first output and the second output, the first summer further having a fifth output that is a difference between the first output and the second output;

a fourth multiplier having as input the fifth output, the fourth multiplier further having a sixth output that is a convolution of the fifth output;

a second low pass filter having as input an in-phase portion of the sixth output, the second low pass filter having a second filtered output;

a fifth multiplier having as inputs the second filtered output and a quadrature portion of the sixth output, the fifth multiplier further having a seventh output;

a second summer having as input the fourth and seventh outputs, the second summer further having an eight output; and a third low-pass filter having as input the eighth output, the third low-pass filter further having a ninth output;

wherein the ninth output is returned to the VCO to complete a feedback loop.

8. The data-and-pilot directed frequency-and-phase lock loop of claim 7, wherein the narrow band-pass filter is centered about an expected pilot frequency.

9. A data-and-pilot directed frequency-and-phase lock loop, comprising:

a pilot-directed acciuisition loop having a pilot input and a pilot output;

a data-directed phase-lock loop having a data input and a data output;

wherein the pilot output and the data output are used to produce a feedback signal that is a non-1inear combination of the pilot input and the data input, and the non-linear combination is performed by adding the pilot input and data input during a first half of each phase, and by inverting the in-phase portion of one of the pilot input and the data input and adding the result to the other of the pilot input and the data input during a second half of each phase.

10. A data-and-pilot directed frequency-and-phase lock loop, comprising:

a pilot-directed acquisition loop having a pilot input and a pilot output;

a data-directed phase-lock loop having a data input and a data output;

wherein the pilot output and the data output are used to produce a feedback signal that is a non-linear combination of the pilot input and the data input, further comprising a plurality of frequency shift multipliers that comprise a first multiplier and a second multiplier that multiply by fixed frequencies having a difference of ½ the symbol rate.

* * * * *

UNITED STATES PATENT AND TRADEMARK OFFICE
CERTIFICATE OF CORRECTION

| | | |
|---|---|---|
| PATENT NO. | : 7,272,203 B2 | Page 1 of 1 |
| APPLICATION NO. | : 10/404553 | |
| DATED | : September 18, 2007 | |
| INVENTOR(S) | : Citta et al. | |

It is certified that error appears in the above-identified patent and that said Letters Patent is hereby corrected as shown below:

<u>Column 12</u>

In the claims, claim 9, line 3, delete "acciuisition" and insert --acquisition--
In the claims, claim 9, line 8, delete "1inear" and insert --linear--

Signed and Sealed this

Eighteenth Day of December, 2007

JON W. DUDAS
*Director of the United States Patent and Trademark Office*